US009620586B2

(12) United States Patent
Salzman

(10) Patent No.: US 9,620,586 B2
(45) Date of Patent: *Apr. 11, 2017

(54) DEVICE HAVING IMPROVED RADIATION HARDNESS AND HIGH BREAKDOWN VOLTAGES

(71) Applicant: Texas Instruments Incorporated, Dallas, TX (US)

(72) Inventor: James Fred Salzman, Anna, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/008,494

(22) Filed: Jan. 28, 2016

(65) Prior Publication Data
US 2016/0163794 A1   Jun. 9, 2016

Related U.S. Application Data

(63) Continuation of application No. 14/496,841, filed on Sep. 25, 2014, now Pat. No. 9,281,232.
(Continued)

(51) Int. Cl.
*H01L 29/00* (2006.01)
*H01L 29/06* (2006.01)
(Continued)

(52) U.S. Cl.
CPC ........ *H01L 29/0649* (2013.01); *H01L 21/266* (2013.01); *H01L 21/28035* (2013.01); *H01L 21/761* (2013.01); *H01L 21/76202* (2013.01); *H01L 27/0623* (2013.01); *H01L 27/092* (2013.01); *H01L 29/0619* (2013.01);
(Continued)

(58) Field of Classification Search
CPC . H01L 21/8238; H01L 27/0922; H01L 29/49; H01L 29/94
See application file for complete search history.

(56) References Cited

U.S. PATENT DOCUMENTS 4,591,890 A    5/1986   Lund et al.
4,990,983 A    2/1991   Custode et al.
(Continued)

OTHER PUBLICATIONS

"Total Dose Radiation-Hardened Latch-Up Free CMOS Structures for Radiation-Tolerant VLSI Designs," IEEE Transactions on Nuclear Science, vol. NS-33, No. 6, Dec. 1986, pp. 1505-1509 (Hatano, et al.).

*Primary Examiner* — Hoai V Pham
(74) *Attorney, Agent, or Firm* — Tuenlap D. Chan; Charles A. Brill; Frank D. Cimino

(57) ABSTRACT

Radiation hardened NMOS devices suitable for application in NMOS, CMOS, or BiCMOS integrated circuits, and methods for fabricating them. A device includes a p-type silicon substrate, a field oxide surrounding a moat region on the substrate tapering through a Bird's Beak region to a gate oxide within the moat region, a heavily-doped p-type guard region underlying at least a portion of the Bird's Beak region and terminating at the inner edge of the Bird's Beak region, a gate included in the moat region, and n-type source and drain regions spaced by a gap from the inner edge of the Bird's Beak and guard regions. A variation of minor alterations to the conventional moat and n-type source/drain masks. The resulting devices have improved radiation tolerance while having a high breakdown voltage and minimal impact on circuit density.

20 Claims, 16 Drawing Sheets

Related U.S. Application Data

(60) Provisional application No. 61/893,579, filed on Oct. 21, 2013.

(51) Int. Cl.
| | |
|---|---|
| *H01L 27/092* | (2006.01) |
| *H01L 29/78* | (2006.01) |
| *H01L 27/06* | (2006.01) |
| *H01L 21/761* | (2006.01) |
| *H01L 21/762* | (2006.01) |
| *H01L 21/266* | (2006.01) |
| *H01L 21/28* | (2006.01) |
| *H01L 29/40* | (2006.01) |
| *H01L 29/66* | (2006.01) |
| *H01L 29/08* | (2006.01) |
| *H01L 29/10* | (2006.01) |
| *H01L 29/16* | (2006.01) |
| *H01L 29/49* | (2006.01) |
| *H01L 27/118* | (2006.01) |

(52) U.S. Cl.
CPC ...... *H01L 29/0638* (2013.01); *H01L 29/0646* (2013.01); *H01L 29/0653* (2013.01); *H01L 29/0847* (2013.01); *H01L 29/1033* (2013.01); *H01L 29/16* (2013.01); *H01L 29/401* (2013.01); *H01L 29/4916* (2013.01); *H01L 29/66681* (2013.01); *H01L 29/78* (2013.01); *H01L 29/7833* (2013.01); *H01L 2027/11894* (2013.01)

(56) References Cited

U.S. PATENT DOCUMENTS

| | | |
|---|---|---|
| 5,220,192 A | 6/1993 | Owens et al. |
| 6,054,367 A | 4/2000 | Groves et al. |
| 6,847,065 B1 | 1/2005 | Lum |
| 2011/0084324 A1 | 4/2011 | Donnelly et al. |

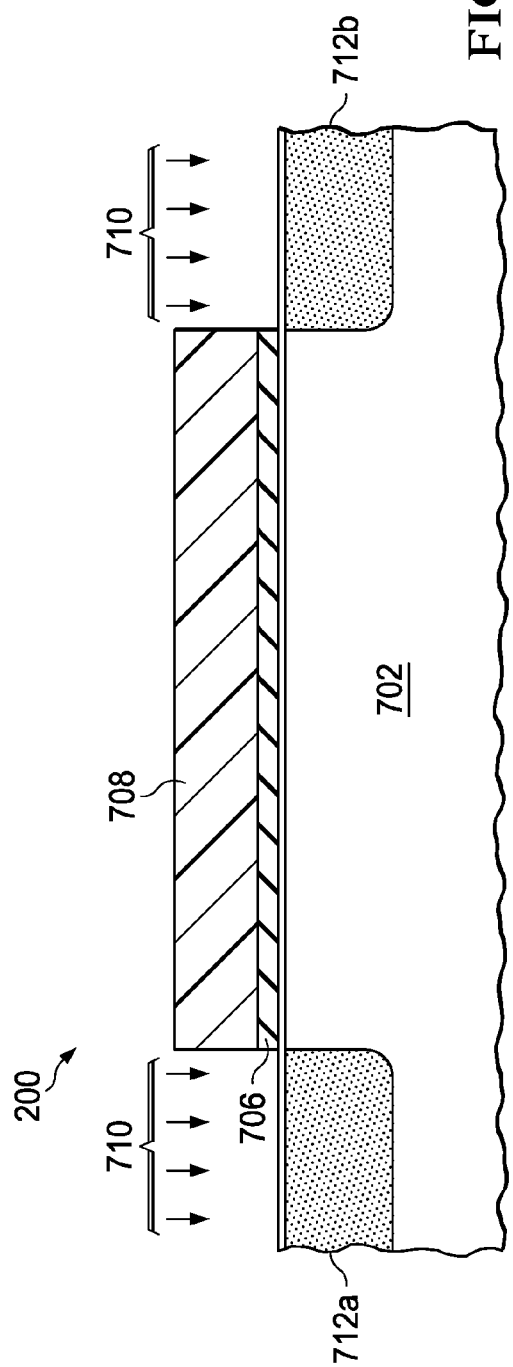
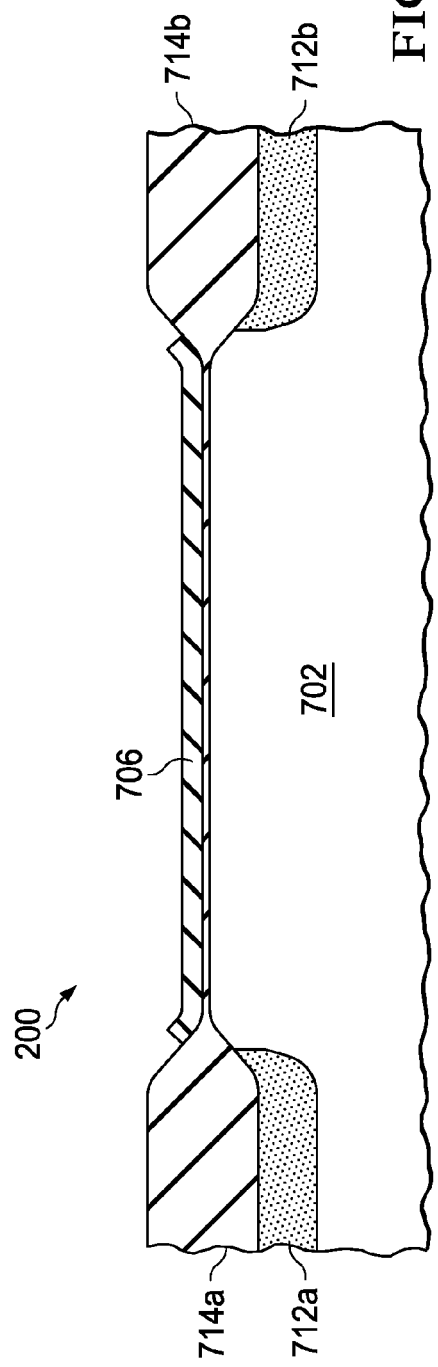

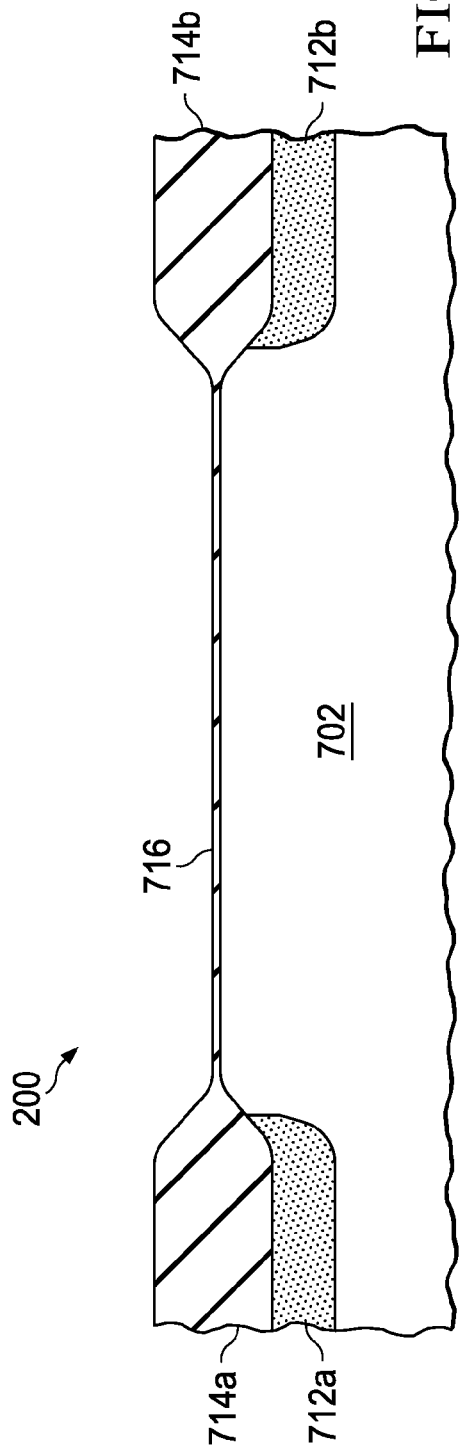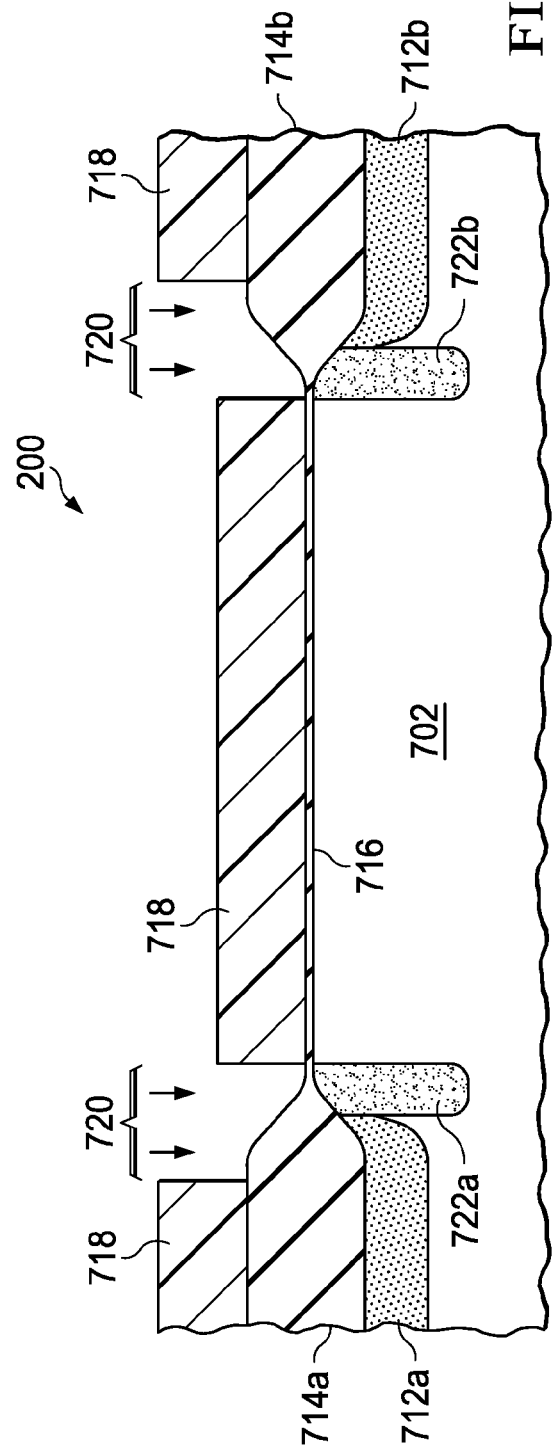

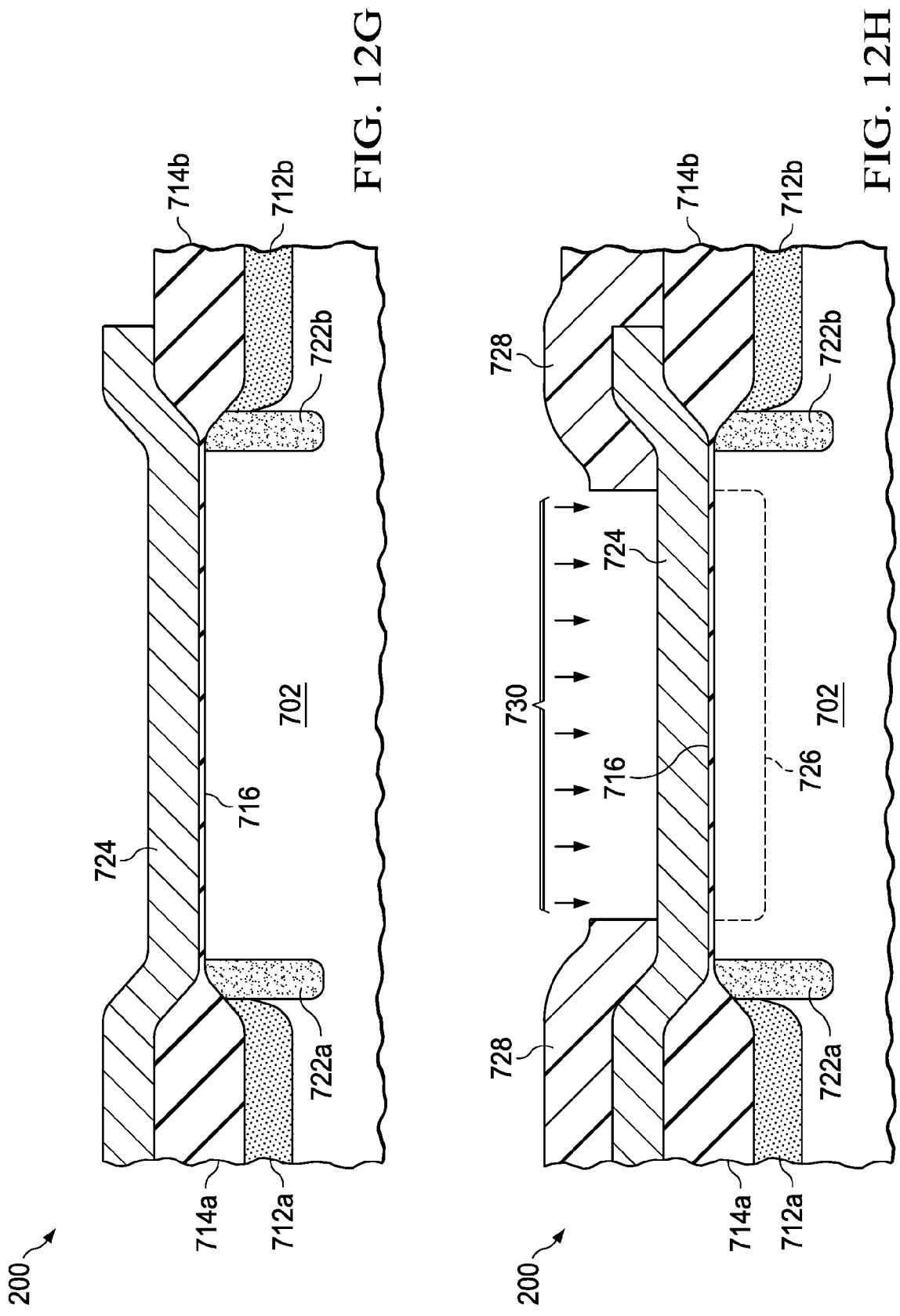

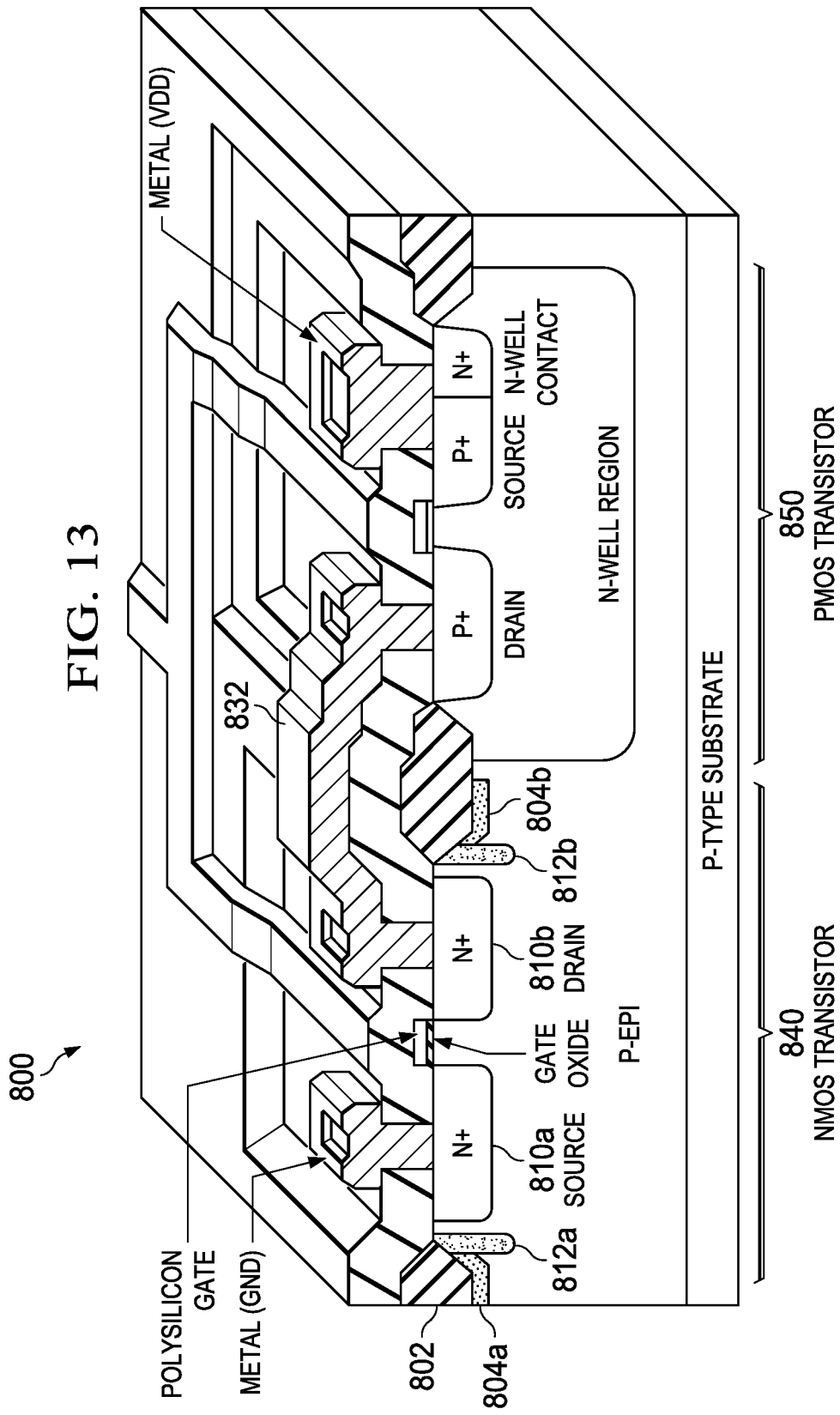

DEVICE HAVING IMPROVED RADIATION HARDNESS AND HIGH BREAKDOWN VOLTAGES

CROSS-REFERENCE TO RELATED APPLICATIONS

Under 35 U.S.C. §§119(e), 120, this continuation application claims the benefit of priority to U.S. patent application Ser. No. 14/496,841, filed on Sep. 25, 2014, which also claims the benefit of priority to U.S. Provisional Application 61/893,579, filed on Oct. 21, 2013. The entirety of both parent applications are incorporated herein by reference.

FIELD OF THE DISCLOSURE

The present disclosure relates generally to the field of semiconductor device manufacturing, and more particularly, to variations on the local oxidation of silicon process for isolation of NMOS transistors in integrated circuits having improved radiation hardness and high breakdown voltages.

Local oxidation of silicon (LOCOS) fabrication processes are used to provide electrical isolation between devices in integrated circuits (ICs). Variations of such processes are known by several names and may be used to fabricate complementary metal oxide semiconductor (CMOS) as well as n-type metal oxide semiconductor (NMOS) circuits and CMOS circuits incorporating bipolar junction transistors (BiCMOS). In these processes, a thick field oxide is thermally grown in isolation regions between adjacent semiconductor devices that are formed in so-called active or "moat" regions under a thin oxide.

LOCOS processes have the advantage of being largely self-aligned, allowing the production of high-density circuits with high manufacturing yield, but there are known issues with this isolation technique. Among the typical issues which must be addressed is the leakage of unintended active parasitic devices turned on by voltage in interconnect lines over the field oxide, which can occur at voltages close to the operating voltage if the doping concentration is low underneath the field oxide. To combat this effect, a common technique is to heavily dope the isolation region before the field oxide is grown to form a "channel stop." This enables the threshold voltage of the isolation region to be raised above the operating voltage of the circuit, preventing parasitic leakage (See FIGS. 1 and 2).

It is also well known that MOS circuits formed using a LOCOS process are not tolerant of ionizing radiation such as may be encountered in space, in nuclear power plants, in medical applications or treatments involving radiation exposure such as CT scans or in the vicinity of a nuclear explosion. When a MOS device is exposed to ionizing radiation, electron-hole pairs are generated in the various oxide regions, resulting in trapped charge and interface states. Due to the materials involved, the effect is a cumulative buildup of positive charge in the oxide, leading to large negative threshold shifts and thus to leakage particularly in parasitic devices associated with NMOS transistors. This leakage leads at least to increased power dissipation, and in a worst case can lead to a failure of operation of the device that incorporates the NMOS transistor. Thinner oxide regions within the isolation region have lower trapping cross-sections to begin with and are thus less susceptible to trapped charge and interface states causing this type of leakage. While techniques exist for growing radiation hard gate oxide material, the thicker field oxide regions are not susceptible to these measures. Increasing the doping of the channel stop to preclude the possibility of radiation-induced inversion layers extending between devices can result in unacceptably low drain-to-substrate breakdown voltages in conventional designs in which the p-type channel stop abuts the n-type source and drain regions. There is also a tapered region where the thick field oxide tapers down to the thickness of the gate oxide called the "Bird's Beak" region. Part of this tapered region is an encroachment region, which forms under the edge of the silicon nitride mask for the moat region during field oxide growth surrounding a MOS transistor. Here, due to its being thinner, its associated parasitic threshold voltage is lower than that of the field oxide, and the usual channel stop implant used to increase the threshold voltage in the field regions does not reach under the nitride. Moreover, pulling the channel stop away from the moat region to increase breakdown voltage further decreases the dopant concentration in the Bird's Beak region and the channel region under the gate, leading to increased source-to-drain leakage from these two paths.

Solutions to prevent parasitic leakages between and within devices by simply using higher doping to increase threshold voltages result in decreased breakdown voltages. Thus numerous radiation tolerant designs have been proposed and implemented involving layouts incorporating heavily-doped guard rings or guard bands, and increased separation of N+ and P+ regions to increase breakdown voltage and counter high capacitance. Hence, these designs face tradeoffs and are typically significantly larger and/or slower than the unmodified devices. For example, Hatano et al. (H. Hatano and S. Takatsuka, "Total dose radiation-hardened latch-up free CMOS structures for radiation-tolerant VLSI designs," IEEE Trans. Nucl. Sci., Vol. NS-33, No. 6, December 1986, pp. 1505-1509) describe several NMOS transistor structures that utilize a P+ guard ring structure within the moat regions and a large space between the N+ source and drain and the guard ring. Lund et al. (U.S. Pat. No. 4,591,890) describe a highly-doped P+ guard region under the field oxide, setting the n-type source and drain well inside the moat region, and a special gate structure to avoid dopant contamination of the separation region. Owens et al. (U.S. Pat. No. 5,220,192) describe moderately-doped p-type regions under the field oxide in addition to p-type guard bands extending into the moat region under the thin gate oxide, also with separation between the guard bands and the N+ source and drain. Groves et al. (U.S. Pat. No. 6,054,367) describes methods of improving the radiation hardness of the Bird's Beak region by increasing the impurity concentration specifically within that region using masking and implantation, but do not counteract a reduction in breakdown voltage resulting from these steps.

There is accordingly a need to further improve the radiation hardness of MOS devices and particularly the NMOS component thereof, while retaining or improving breakdown voltages and with minimal impact on circuit density or additional complexity of design.

SUMMARY OF THE DISCLOSURE

These and other problems associated with the prior art are addressed by the present disclosure, which provides MOS devices having improved radiation hardness by separating the source and drain regions from the Bird's Beak region to eliminate radiation-induced leakage along the Bird's Beak leakage path between the source and drain regions while retaining a high breakdown voltage, and methods of fabricating these devices and integrated circuits incorporating them. This is accomplished by separating the source and drain regions from the Bird's Beak regions, specifically in the areas underlying where gate lines would cross the Bird's Beak region, which by pulling back the source and drain from the edge of the Bird's Beak into the moat region to increase the breakdown voltage while retaining a predetermined electrical width.

The present disclosure can be used to improve the radiation hardness of NMOS, CMOS, or BiCMOS integrated circuits produced using variations of a LOCOS technology. Digital, analog, or mixed-signal circuits can be implemented using the devices and processes provided herein. Devices produced in accordance with the present disclosure operate at speeds and current levels comparable to conventional unmodified NMOS transistors, while having a minimal impact on transistor size and thus circuit density. Breakdown voltages are maintained or even improved, thus allowing high voltage operation of circuits produced in accordance with the present disclosure.

More specifically, the present disclosure provides a radiation hardened MOS device. The device includes a p-type silicon substrate, a field oxide surrounding a moat region on the substrate tapering through a Bird's Beak region to a gate oxide within the moat region, a gate completely surrounding the n-type source and drain regions spaced by a gap from the inner edge of the Bird's Beak region.

The present disclosure also provides a method of fabricating a radiation hardened MOS device by providing a silicon substrate with a P– layer within the top surface and a pad oxide layer on the top surface, and then forming a masking layer to define a moat region. Then the substrate is oxidized to form a field oxide layer in areas not covered by the masking layer, terminating in a Bird's Beak region extending beneath the masking layer. The masking layer and pad oxide are removed, and a gate oxide is formed within the moat region. A gate is then formed overlying the gate oxide and extending in width and length direction across the moat region, defining a channel area and crossing the Bird's Beak region onto the field oxide on at least one edge of the moat region. An n-type impurity is implanted into source and drain regions that are spaced away from the Bird's Beak region by a gap while having a width along the channel area that is equal to a predetermined electrical width. The fabrication of the radiation hardened MOS device is then completed on the substrate.

The present disclosure additionally provides an integrated circuit (IC) device fabricated according to the method just described and that includes one or more devices in addition to a radiation hardened MOS device.

Other features and advantages of the present disclosure will be apparent to those of ordinary skill in the art upon reference to the following detailed description taken in conjunction with the accompanying drawings.

DESCRIPTION OF THE VIEWS OF THE DRAWINGS

The above and further advantages of the disclosure may be better understood by referring to the following description in conjunction with the accompanying drawings, in which:

FIGS. 12A through 12H show cross-sectional views of a portion of an MOS integrated device illustrating various stages in a process used to produce a radiation-hardened MOS device in accordance with one embodiment of the present disclosure; and FIG. 13 is a cross-sectioned isometric view of a portion of an MOS integrated device illustrating the integration of a radiation hardened NMOS transistor with a NMOS transistor in accordance with another embodiment of the present disclosure.

In the drawings, like reference numerals are sometimes used to designate like structural elements. It should also be appreciated that the depictions in the figures are diagrammatic and not to scale.

DETAILED DESCRIPTION

Figure 1:
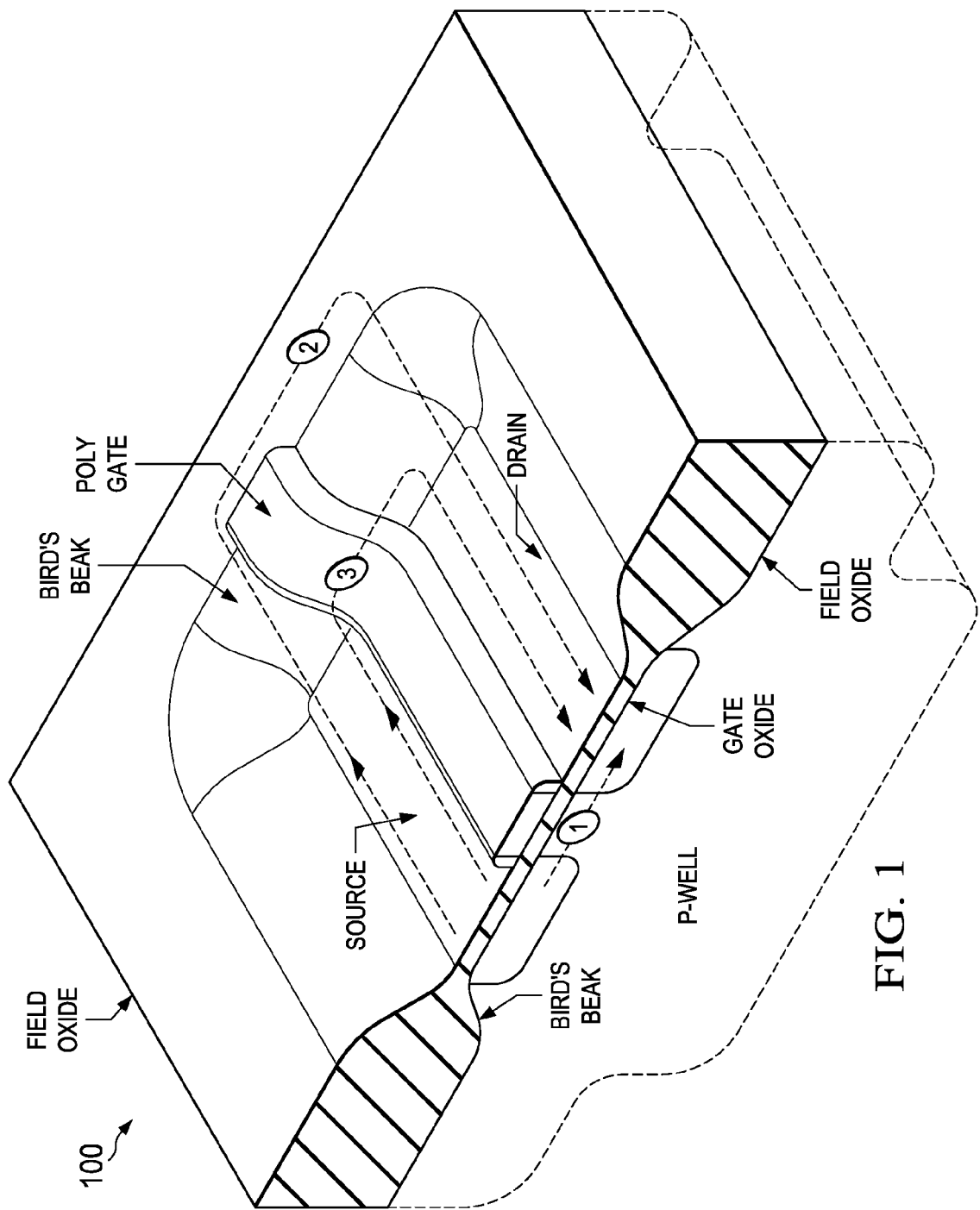
FIG. 1 is a cross-sectioned isometric view of an NMOS LOCOS isolated transistor showing three radiation-induced leakage paths.

Referring to FIG. 1, there is shown a cross-sectioned isometric view of a typical NMOS transistor device 100 which can be part of an integrated circuit having multiple such transistors such as an NMOS device, a CMOS device (the PMOS transistor not being shown), or a BiCMOS device (which would additionally include bipolar junction transistors. In the illustrated device, the NMOS transistor is formed in a "p-well" which is a lightly doped p-type region formed within a silicon substrate. Alternatively, an entire top layer several micrometers thick or more of the silicon substrate can be lightly doped p-type material. The device 100 as illustrated in FIG. 1 is typical of one produced using a local oxidation of silicon (LOCOS) process used for isolating devices. It can be seen that a source and drain region are formed within a so-called "moat region" covered by a thin gate oxide, and surrounded by an isolating field oxide. Typical thicknesses for these oxides are in the range of 75 to 500 angstroms for a given implant energy—such as 50-200 ke V including a gate oxide and 8,000 to 10,000 angstroms for a field oxide. The transition region at the edge of the moat in which the oxide thickness tapers from the thin gate oxide to the thick field oxide is known as the "Bird's Beak" region as suggested by its shape in the cross-section.

Three radiation-induced source-to-drain current leakage paths that can be caused by threshold voltage shifts are shown: path 1 under the gate oxide layer, path 2 under the field oxide layer, and path 3 under the Bird's Beak region. Field oxide leakage is commonly controlled using a channel stop implant to place p-type impurity (not shown) under the field oxide before the oxidation step, gate oxide leakage may be controlled by controlling the properties of the gate oxide material, and solutions for Bird's Beak leakage are of primary relevance and interest herein.

Well known in the present art are the designations "P−", "P", and "P+" to describe ranges of doping concentrations of p-type dopants, and "N−", "N", and "N+" to describe ranges of doping concentrations of n-type dopants, where "P−" and "N−" refer to doping concentrations of $10^{14}$-$10^{16}$ cm$^{-3}$, "P" and "N" refer to concentrations of $10^{16}$-$10^{19}$ cm$^{-3}$, and "P+" and "N+" refer to concentrations of $10^{19}$-$10^{21}$ cm$^{-3}$. These dopant concentrations can be introduced into the substrate by a number of different processes, but ion implantation will be described herein as an example process capable of placing the dopants precisely where they are required. For a given implant energy, peak volumetric concentrations are approximately proportional to the "dose" of the implant, given in units of cm$^{-2}$, which is a quantity easily specified during processing.

In an NMOS transistor 100 as shown in FIG. 1, the source and drain consist of heavily-doped N+ regions implanted into a lightly-doped P− substrate, surface layer, or well. The region under the gate is called the "channel," the dimension of the gate in the direction from source to drain (as indicated by path 1) is called the "length," and the dimension of the source and drain sideways along the gate is called the "width." These dimensions determine the performance characteristics of the transistor; for example, a MOS transistor device with a larger width can pass more current for the same applied gate voltage, all other variables being the same. Therefore, these dimensions are specified during the design of circuits using such devices, and alterations to the device design, e.g. to improve radiation hardness, should leave dimensions such as the width approximately unchanged in order for the device to behave the same in a circuit. In designs for a conventional LOCOS process, the mask pattern for the source and drain ("n-source/drain" or NSD for an NMOS device) may be oversized from the moat pattern in order to take advantage of self-alignment of the edges of moat offered by the field oxide acting as a masking layer for the n-type implant, and the edges of the source and drain next to the gate are similarly self-aligned since they are masked by the gate itself.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Figure 3:
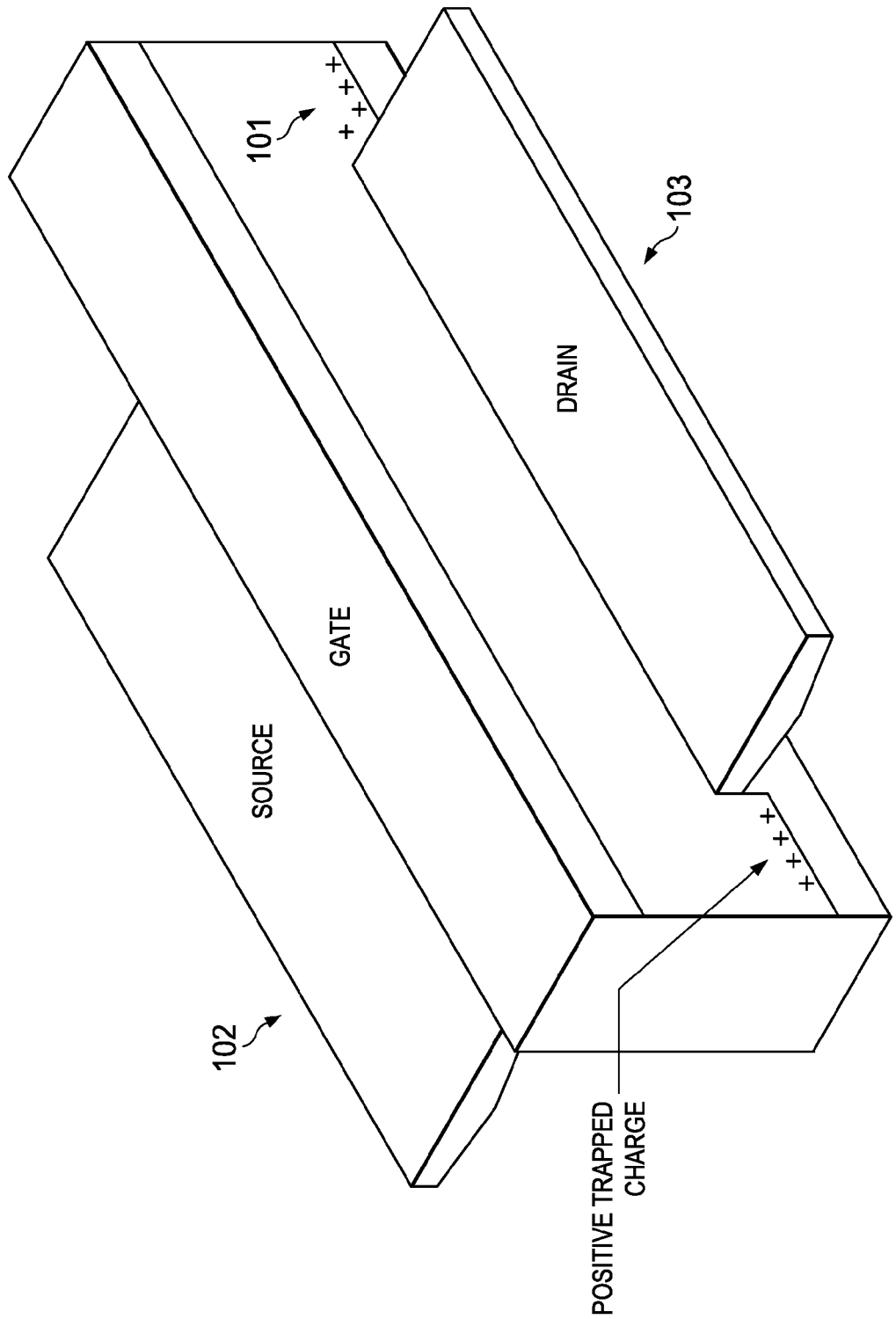
FIG. 3 illustrates a simplified view of the radiation-hardened MOS device of FIG. 1.
Figure 3A:
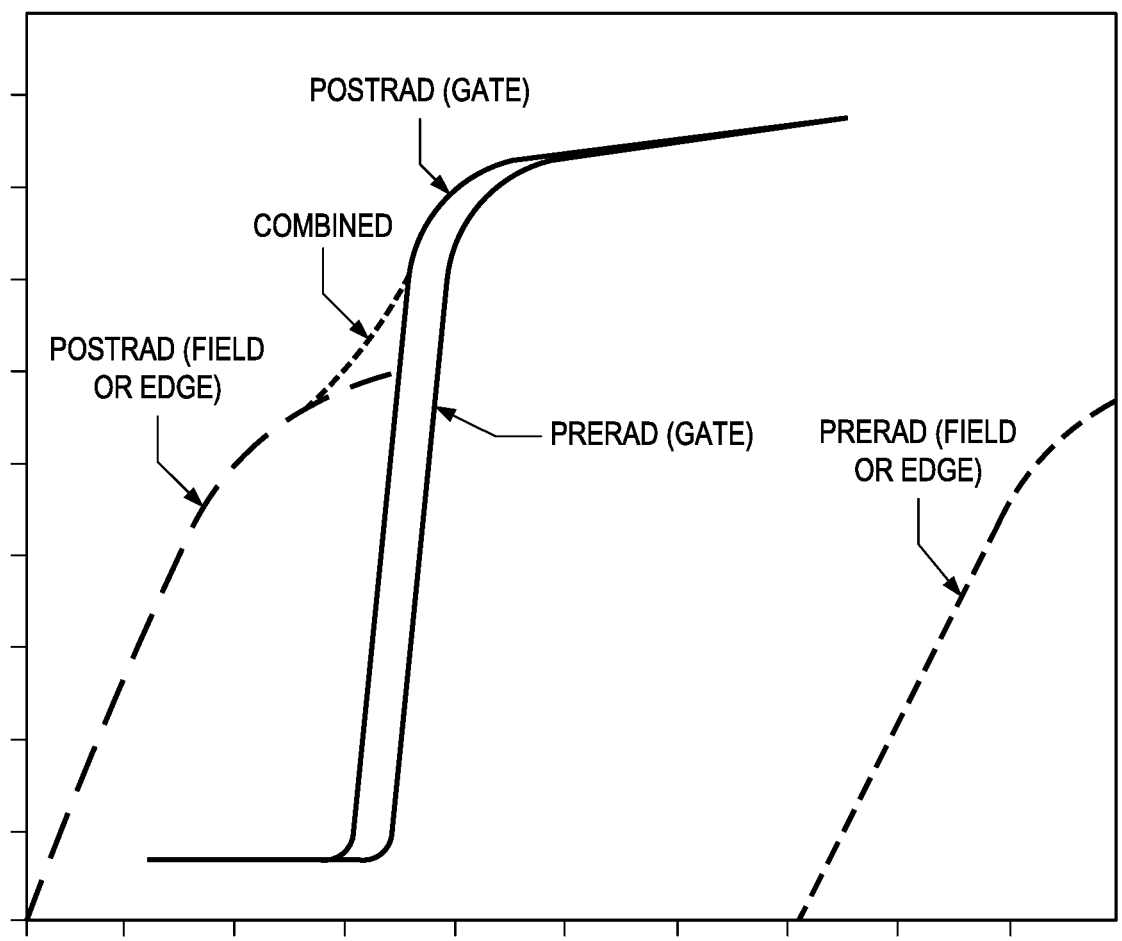
FIG. 3A illustrates the effect of trapped charges on an MOS transistor.
Figure 4:
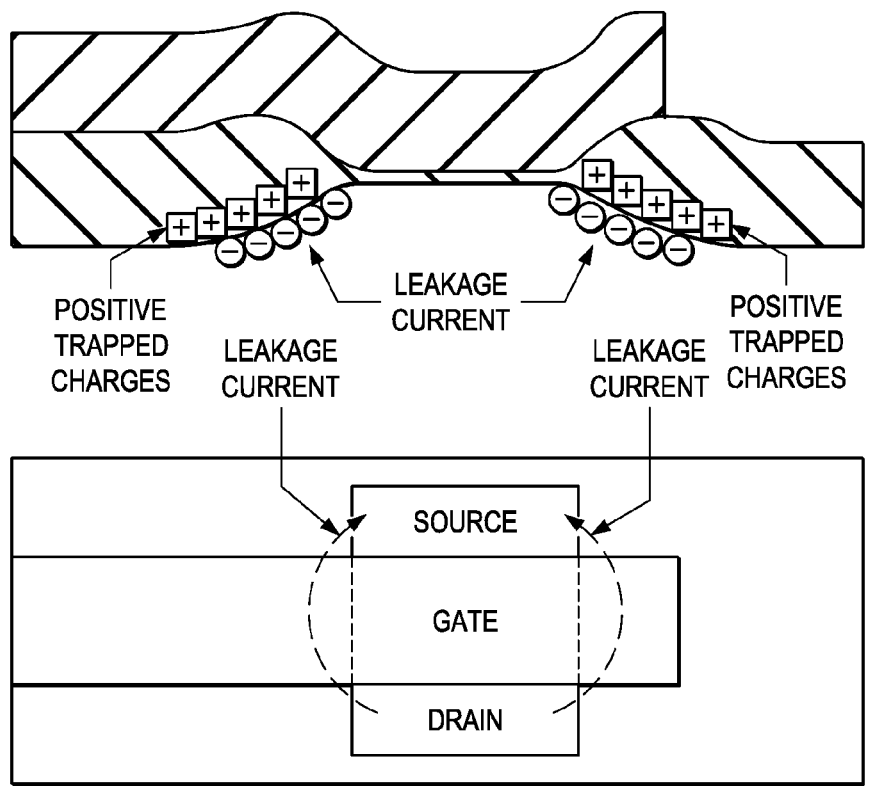
FIG. 4 illustrates Edge Leakage: due to charge trapping in region of transition from gate oxide to field oxide—Bird's Beak region formed by LOCOS process.

FIG. 3 is an example of a structure for a CMOS device. As illustrated in FIG. 3, field oxides (FOX) also known as LOCOS isolation 101 can cause IC failure at total dose levels as low as 5 krad(SI). Where the unit RAD is known as Radiation Absorbed Dose. Positive charge can invert p-type surfaces under the field oxide, creating a leakage path between the source 102 and drain 103 of a transistor and between transistors. Similarly the gate oxide can trap charge inverting the channel. Limiting trapped charge in the FOX and Gate dielectric will improve radiation tolerance.

FIG. 2 is a graphical representation of leakages induced across both gates and field edges for Pre-radiation and Post-radiation conditions.

Figure 5:
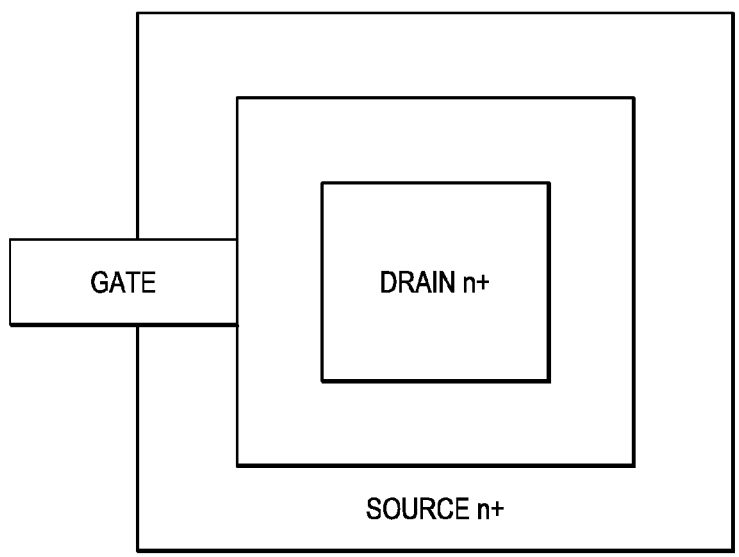
FIG. 5 illustrates a plan view of an MOS transistor configured to have the gate structure surrounding the drain.
Figure 6:
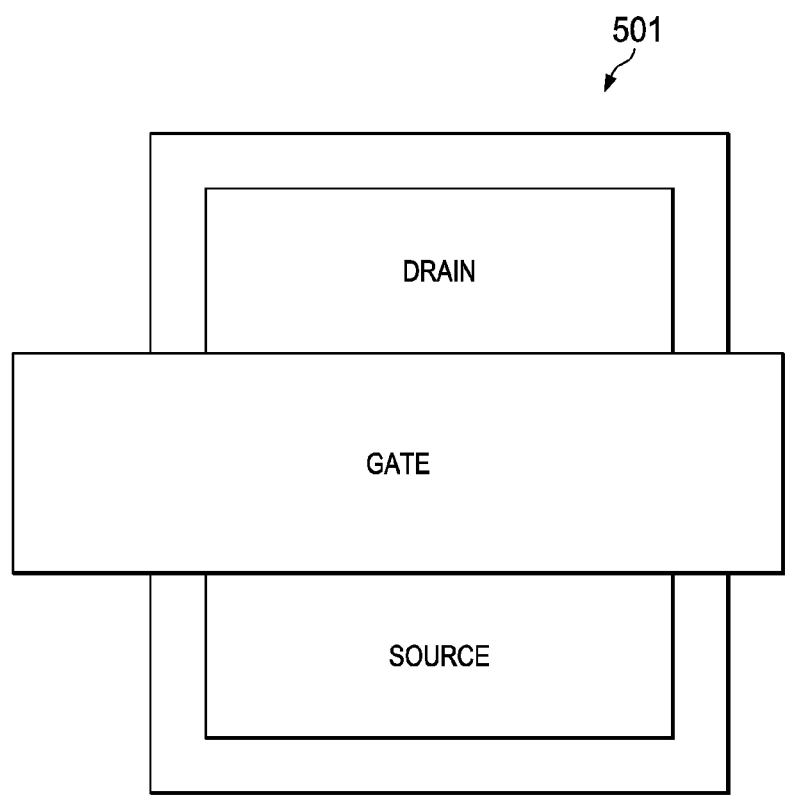
FIG. 6 illustrates a plan view of an MOS transistor configured to have a compensating implant to overcome a trapped charge problem.

FIG. 3 is a graphical representation of edge leakage due to charge trapping in the region of transition from gate oxide to field oxide wherein the field oxide exhibits a Bird's Beak region formed by the LOCOS process. A typical method of overcoming this trapped charge problem is shown in FIG. 5, wherein the drain is completely surrounded by the gate and the source is completely outside the encircling gate thus eliminating the field oxide edge between the source and drain. FIG. 6 illustrates another method of solving the field edge by providing an implant under the Bird's Beak 501, to neutralize the charge generated by radiation effect. The Bird's Beak implant requires an addition mask.

The impact of total dose radiation on transistors is conditional. Radiation-induced charging (usually positive) of dielectrics, leads to the turn-on of parasitic oxide transistor comprising a well isolation whether it is LOCOS or shallow trench isolation (STI). (In submicron technologies the gate oxides are so thin that intrinsic total dose effects are minimal.)

Figure 7:
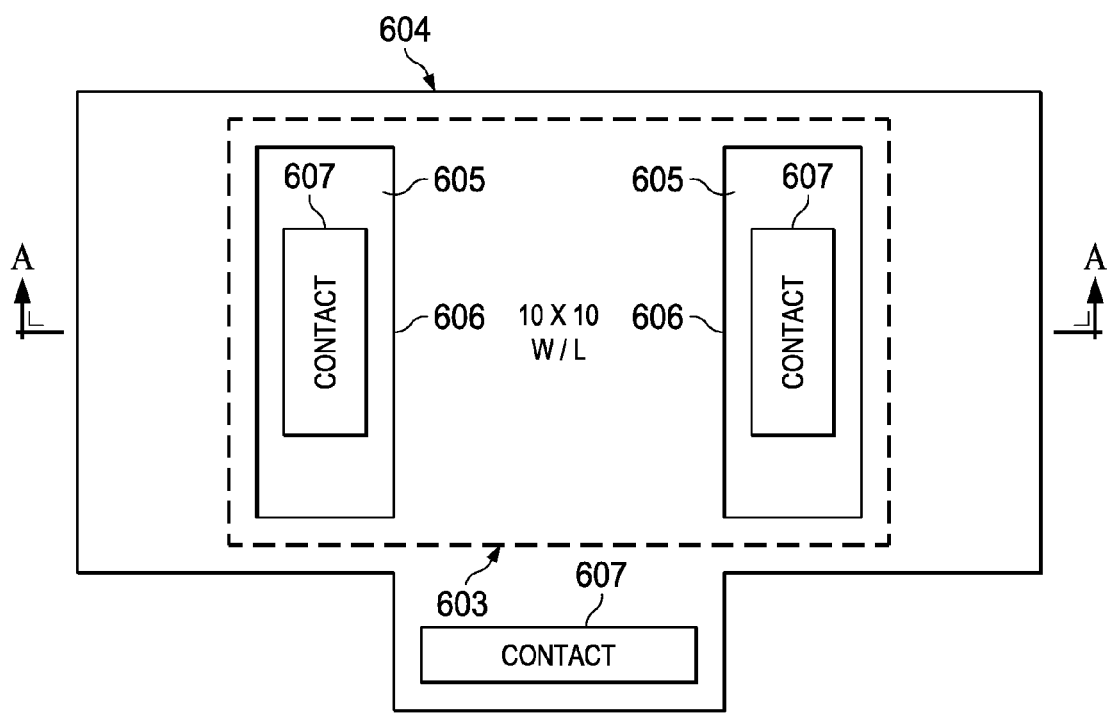
FIG. 7 is a plan view of a long channel transistor utilizing the disclosure of the present application according to an embodiment of this disclosure.

In an embodiment of a long channel transistor of the present disclosure FIG. 7 the Source/Drain implant is pulled back (nested) from Bird's Beak region by using gate mask with open areas for Source/Drain implants. Separation of the Source/Drain implant from the Bird's Beak will lower leakage caused by radiation considerably. Gate oxide completely covers the opening in the LOCOS isolation.

Figure 7A:
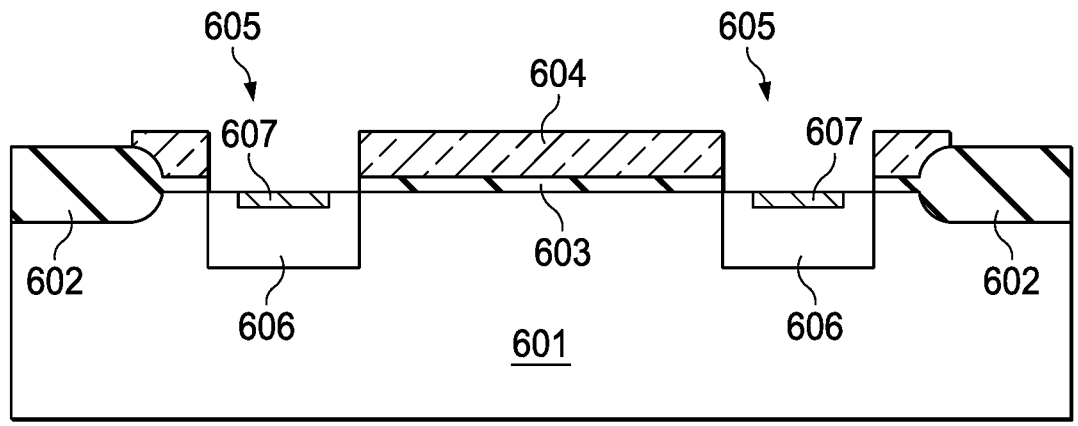
FIG. 7A is a cross section of FIG. 7 at section A-A.
Figure 7B:
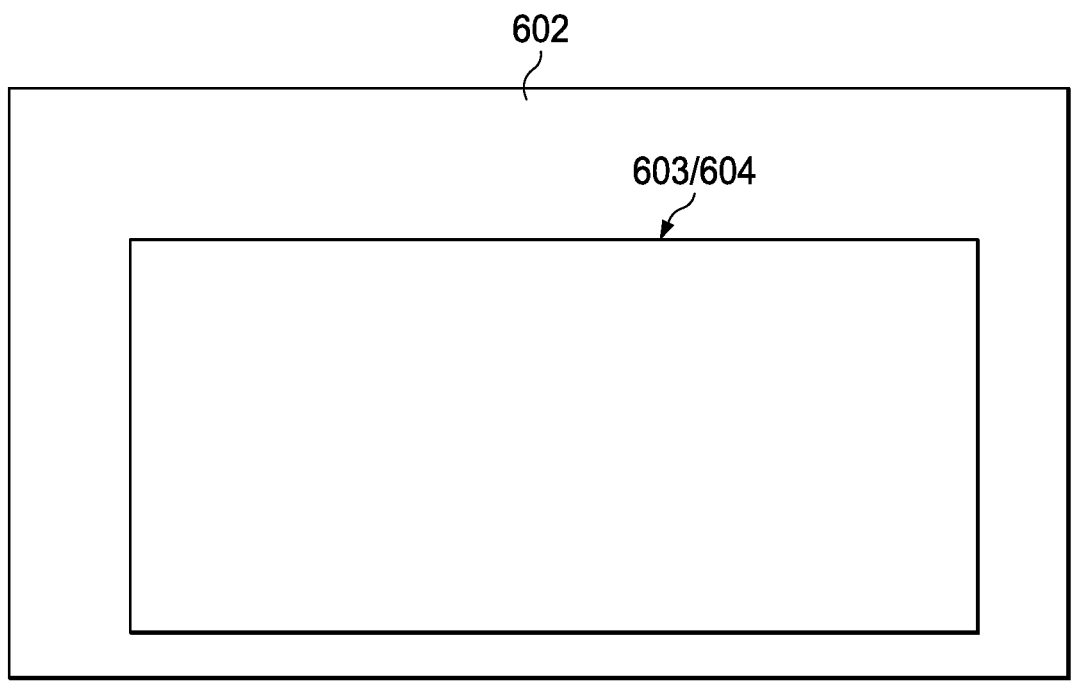
FIGS. 7B-7D are plan views of the transistor in FIG. 7 in various stages of the process.
Figure 7C:
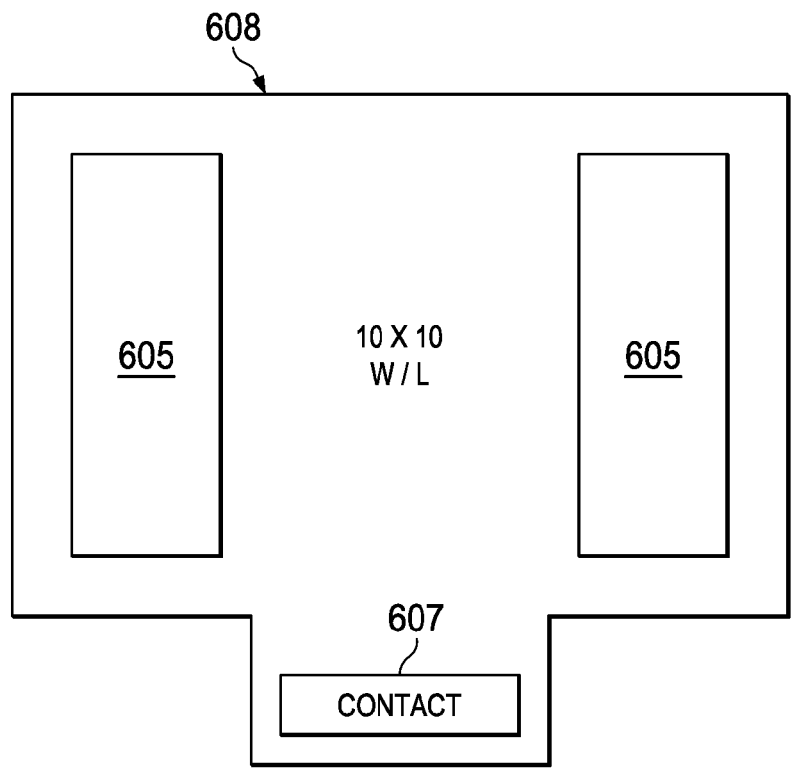
Figure 7D:
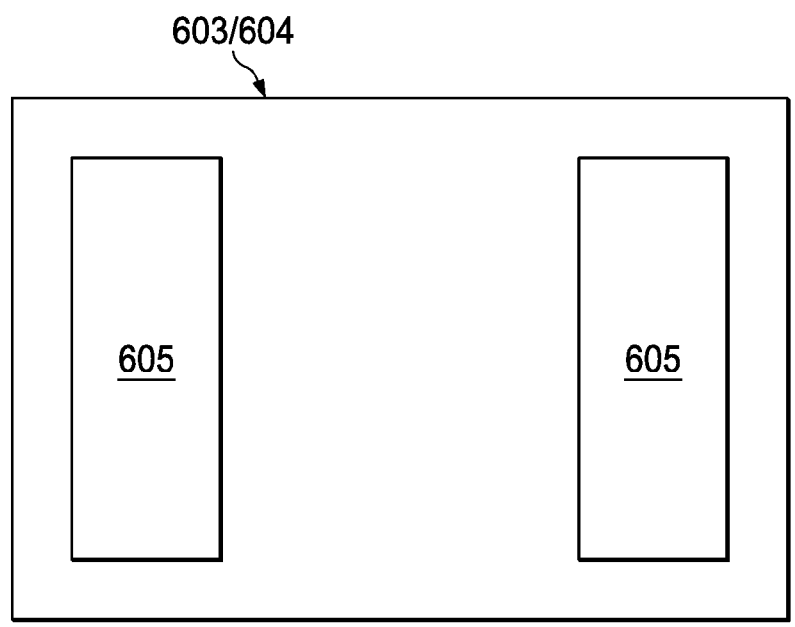

FIG. 7A shows a cross section of FIG. 7 at section A-A. FIGS. 7B-7D detail definition of the Source/Drain openings in the gate structure 603/604. The transistor is comprised of a substrate 601. A field oxide 602 grown on the top and into the surface of the substrate, wherein the field oxide includes an opening containing a transistor. A gate oxide 603 grown over and touching the field oxide. A layer of polycrystalline silicon 604 grown over and touching the gate oxide, wherein the combination of the gate oxide 603 and the layer of polycrystalline silicon 604 completely covers the opening in the field oxide FIG. 7B. Source/Drain openings 605, defined by a gate mask 608, and etched into and through the polycrystalline silicon and the gate layers touching the underlying substrate FIG. 7D. Source/Drain implants 606 deposited through the Source/Drain openings and into the substrate to form the source and drain of a transistor. Finally, a photoresist process is utilized to define contact areas in the Source, Drain and Gate. Metal is then deposited in the contact areas in the Source, Drain and Gate to form contacts to the contact areas in the Source, Drain and Gate 607.

Figure 8:
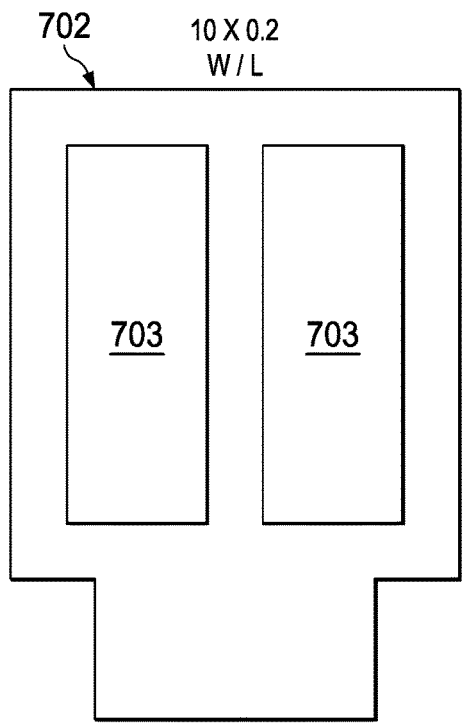
FIGS. 8-9 are plan views of a short channel transistor utilizing the disclosure of the present application according to an embodiment of this disclosure.
Figure 9:
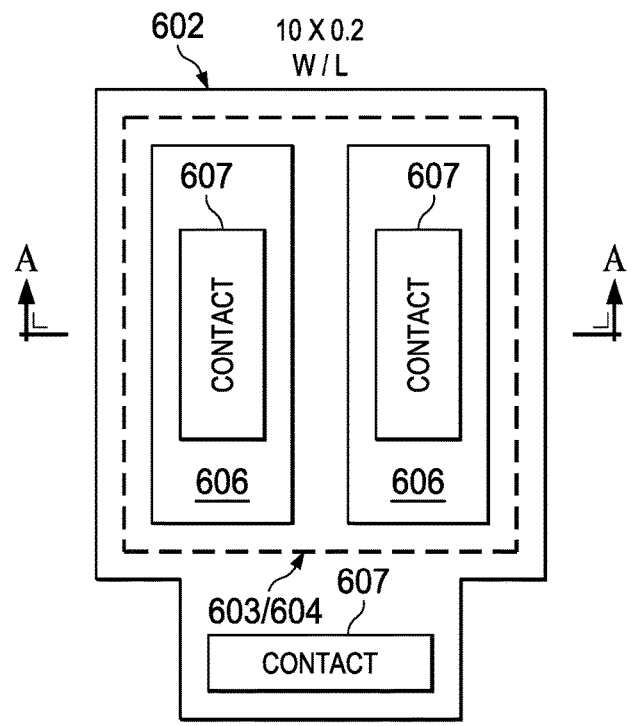

In another embodiment, a short channel transistor of the present disclosure FIGS. 8-9 the Source/Drain implant 605 is pulled back (nested) from Bird's Beak region by using gate mask 702 with open areas for Source/Drain implants 703. Separation of the Source/Drain implant from the Bird's Beak will lower leakage caused by radiation considerably. A Gate structure 603/604 completely covers the opening in the LOCOS isolation 602.

A cross section of FIG. 9 is also represented in FIG. 7A. FIG. 7 is a long channel version of FIG. 8 and is therefore very similar. FIG. 7A can also represent a cross section of FIG. 8 at section A-A. FIGS. 6B-6D detail definition of the Source/Drain openings in the gate structure 603/604. The transistor is comprised of a substrate 601. A field oxide 602 grown on the top surface of the substrate, wherein the field oxide includes an opening containing a transistor. A gate oxide 603 grown over and touching the field oxide. A layer of polycrystalline silicon 604 grown over and touching the gate oxide, wherein the combination of the gate oxide 603 and the layer of polycrystalline silicon 604 completely covers the opening in the field oxide FIG. 6B. Source/Drain openings 605, defined by a gate mask 608, and etched into and through the polycrystalline silicon and the gate layers touching the underlying substrate FIG. 7D. Source/Drain implants 606 deposited through the Source/Drain openings and into the substrate to form the source and drain of a transistor. Finally, a photoresist process is utilized to define contact areas in the Source, Drain and Gate. Metal is then deposited in the contact areas in the Source, Drain and Gate to form contacts to the contact areas in the Source, Drain and Gate 607.

Figure 10:
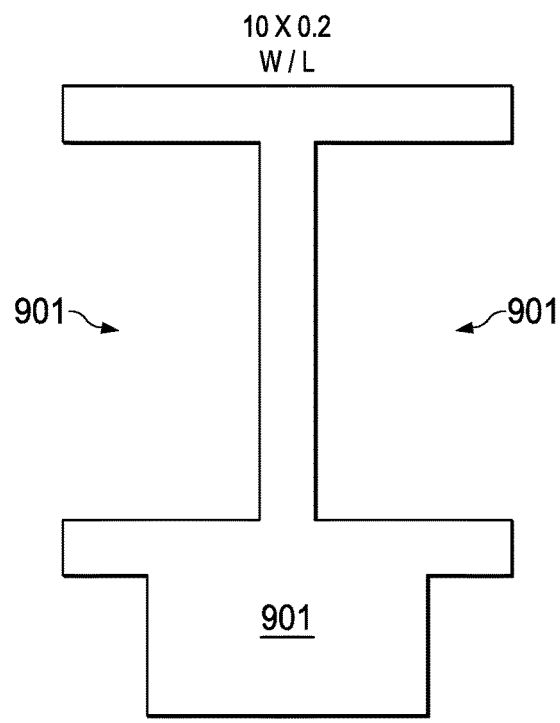
FIGS. 10-11 and 11A are plan views of a short channel transistor utilizing the disclosure of the present application according to an embodiment of this disclosure.
Figure 11:
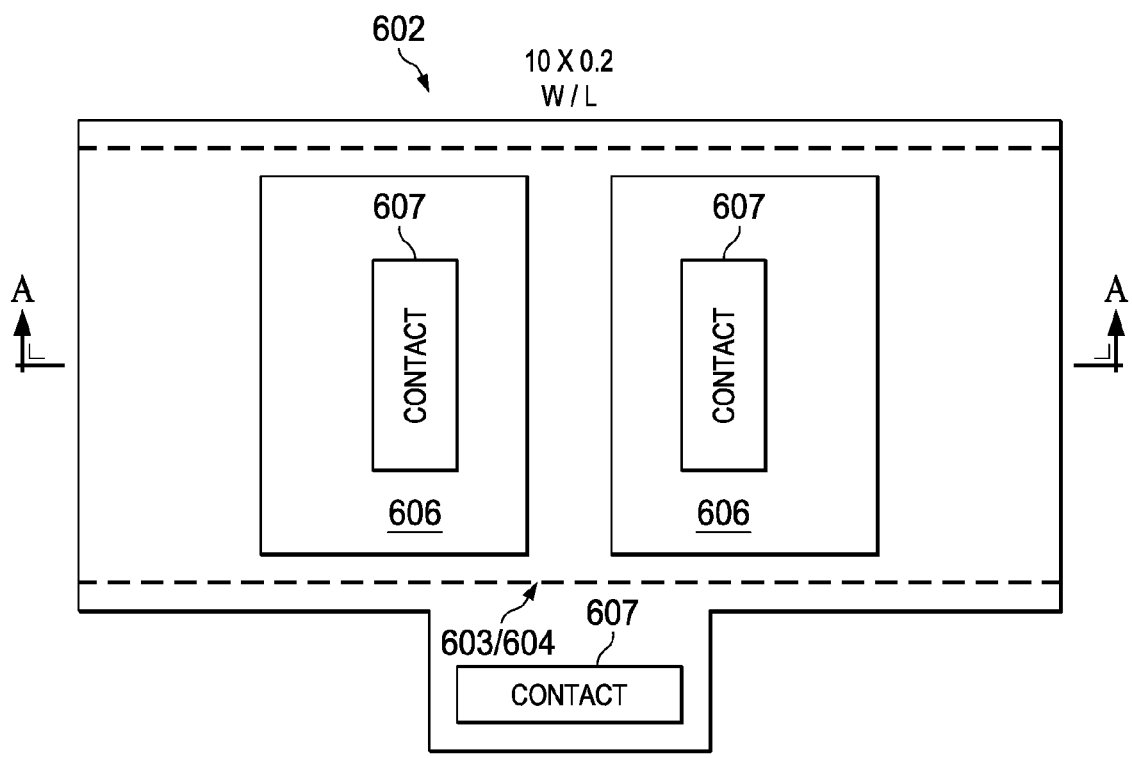
Figure 11A:
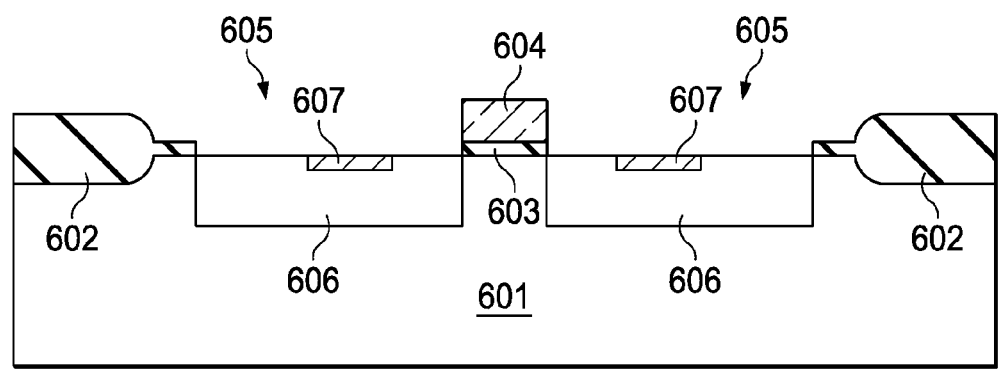

In a third embodiment, a short channel transistor of the present disclosure FIGS. 10-11 and 11A, the Source/Drain implant location 605 is pulled back (nested) from Bird's Beak sidewall region by using T-gate mask 901 with open areas for Source/Drain implants 902. Separation of the Source/Drain implant from the Bird's Beak will lower leakage caused by radiation considerably. A Gate structure 603/604 completely covers the opening in the LOCOS isolation 602.

FIG. 11A shows a cross section of FIG. 10 at section A-A. The transistor is comprised of a substrate 601. A field oxide 602 grown on the top and into the surface of the substrate, wherein the field oxide includes an opening containing a transistor. A gate oxide 603 grown over and touching the field oxide. A layer of polycrystalline silicon 604 grown over and touching the gate oxide, wherein the combination of the gate oxide 603 and the layer of polycrystalline silicon 604 completely covers the opening in the field oxide FIG. 10. Source/Drain openings 605, defined by a gate mask 901, and etched into and through the polycrystalline silicon and the gate layers touching the underlying substrate. Source/Drain implants 606 deposited through the Source/Drain openings and into the substrate to form the source and drain of a transistor. Finally, a photoresist process is utilized to define contact areas in the Source, Drain and Gate. Metal is then deposited in the contact areas in the Source, Drain and Gate to form contacts to the contact areas in the Source, Drain and Gate 607.

In practice, forming the device disclosed in this disclosure includes; providing a single crystal silicon substrate 601. The substrate can be doped either p-type or n-type. A layer of dielectric is grown on the top surface of the substrate. The dielectric layer can be Silicon Nitride (SiN). A pattern is defined in the dielectric layer using standard photolithography techniques wherein the patterns include openings in the dielectric. A LOCal Oxidation of Silicon (LOCOS) or shallow trench isolation (STI) operation can be performed to create a field oxide 602. The original dielectric is then removed providing non-oxidized openings in the field oxide exposing the underlying silicon. A gate oxide film 603 is then deposited over the wafer and subsequently a layer of polycrystalline silicon 604 is deposited on the gate oxide film thus providing islands of silicon covered with gate oxide and polycrystalline silicon. A photoresist layer is deposited on the layer of polysilicon and a gate mask is used to define source/drain 605 openings in the polysilicon layer 604 and the gate oxide 603 layer extending down to the top surface of the substrate.

Dopants are implanted through the source/drain 605 openings in the polysilicon/gate and gate oxide, thus providing sources and drains 606 for transistor 601. A dielectric layer is then deposited on the wafer. A photoresist process and mask is the used to define contact areas 607 in the source, drain and gate using standard photoresist processes. A metal film is then deposited and defined to form contacts on the device and any other connections required by the design.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

TABLE 1

Breakdown voltage $BV_{DSS}$ as a function of implant doses and NSD pattern pullback.

| NSD Pullback (μm) | CHSTOP Dose ($\times 10^{14}$ cm$^{-2}$) | BB Dose ($\times 10^{13}$ cm$^{-2}$) | | | | | |
|---|---|---|---|---|---|---|---|
| | | 0 | 0.8 | 1.0 | 2.0 | 3.0 | 4.0 |
| 0 | 0.3 | 13.9 | | | | | |
| | 2.0 | | | | | 8.7 | 8.1 |
| | 2.5 | | | | 9.2 | 8.4 | 7.9 |
| | 3.0 | | | 9.0 | | | |
| 1.6 | 2.0 | | | | | 15.0 | 15.0 | 15.0 |
| 2.0 | 2.0 | | | | | 15.2 | 14.9 | 15.1 |

It can be seen that breakdown voltage is improved over the baseline even at high BB doses for an NSD pullback of 1.6 μm or more. Without pullback, "Bird Beak" BB doses of over $1\times10^{13}$ cm$^{-2}$ lead to a lowered breakdown voltage. Yield data (not shown) also have shown that without NSD pullback, yield drops off for BB doses increasing over $1\times10^{13}$ cm$^{-2}$. In conjunction with the pullback, BB doses can be increased in this process to over $4\times10^{13}$ cm$^{-2}$ thus lowering BB leakage without breakdown voltage. Experiments with radiation exposure have verified low leakage current with exposure to total radiation doses of up to 120 krad for NSD spacings of 1.6 and 2.0 μm, and BB doses of $4\times10^{13}$ cm$^{-2}$, as in the lower-right corner of Table 1, where with no pullback, leakage increases below 50 krad because BB doses are limited to $1\times10^{13}$ cm$^{-2}$ before breakdown becomes a problem.

As will be appreciated by those skilled in the art, many other layout variations are possible that achieve low Bird's Beak leakage by increasing the doping under the Bird's Beak region in the vicinity of gate crossings, and also keep breakdown voltage high by spacing the source and drain regions away from the Bird's Beak region.

Figure 12:
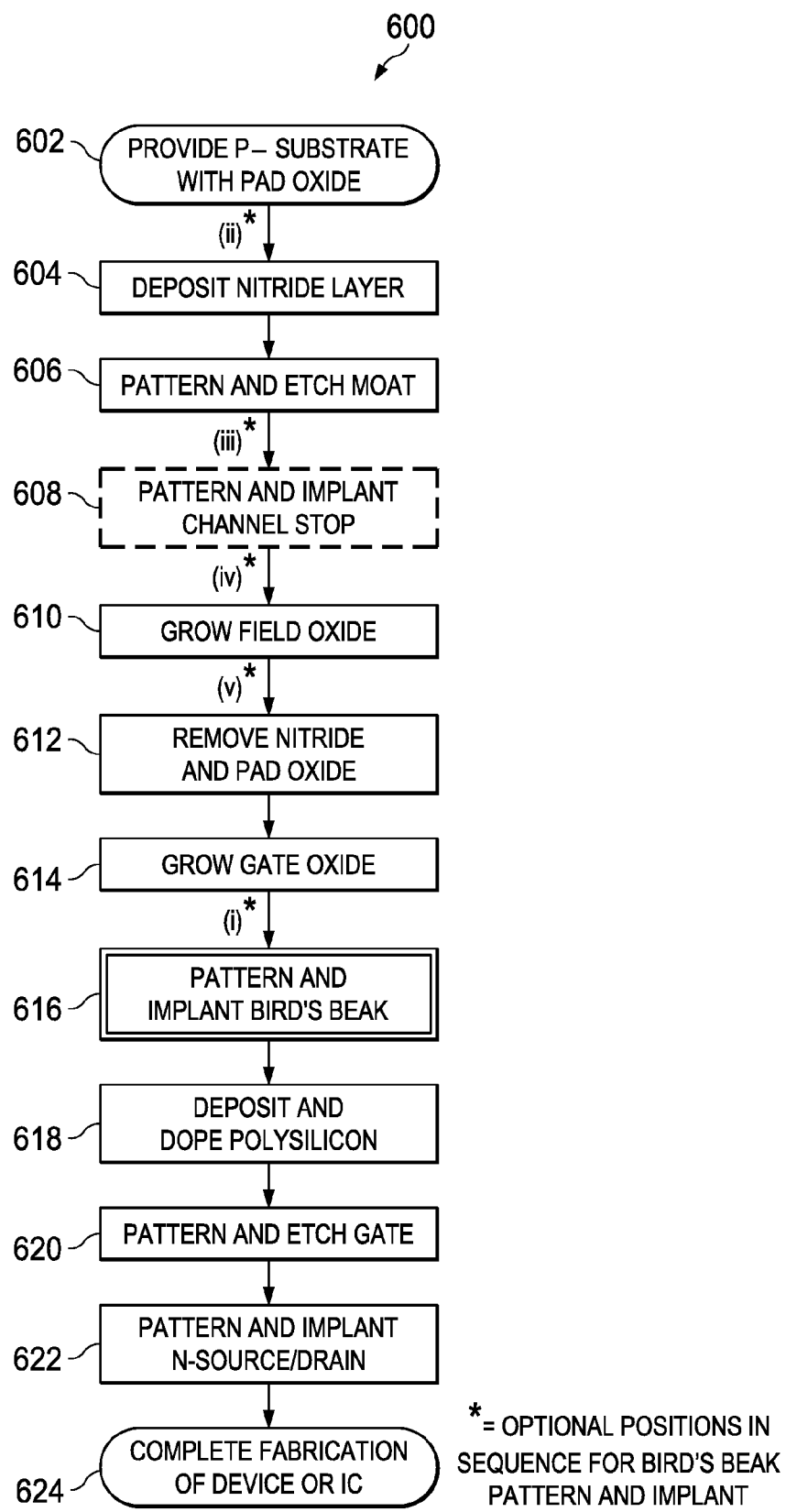
FIG. 12 is a flow chart depicting a method of fabricating the disclosure of the present application according to an embodiment of this disclosure.

Now referring to FIG. 12, a flow chart illustrating an exemplary process flow 600 suitable for fabricating a radiation hardened MOS device according to the principles of the present disclosure is shown. This is a basic flow including essential steps and a few required for illustration. Not shown in the flow chart are optional process steps to form additional types of devices, such as PMOS or bipolar transistors, or other devices such as diodes, resistors, and capacitors; or to form circuits such as CMOS, BiCMOS integrated circuits on the same wafer in conjunction with the devices of the present disclosure; or to adjust the performance of the NMOS devices. Such additional steps may be used in conjunction with, but are not essential to, the practice of the present disclosure. There are also steps well known in the art for improving device reliability such as the growth of dummy or sacrificial oxides before threshold adjusting implants, or cap oxides over the polysilicon gates, which have been omitted where they do not affect the essential steps. In addition, some combinations of basic steps have been included in the steps shown. For example, an "implant" step includes any subsequent annealing, activation, or diffusion step that may be required to form desired profiles and concentrations, and any "pattern & implant" or "pattern & etch" block should be understood to include a resist strip afterwards, which in itself may consist of several detailed steps.

Process 600, FIG. 12, begins in block 602 by providing a lightly doped p-type silicon substrate with a pad oxide layer deposited upon its top surface. As explained earlier, the substrate may be a uniformly doped substrate, but is preferably a heavily-doped substrate (for example P+) with a lightly-doped epitaxial layer several micrometers thick on top (for example, P− or "p-epi"). It can also be an n-type wafer having p-wells formed in it in which the subsequent process for NMOS transistors will be implemented, as illustrated in FIG. 1. A nitride layer is deposited in block 604, and then patterned and etched using the MOAT pattern in block 606. As widely accepted terminology, "patterning" refers to the process of applying, exposing, and developing photoresist to make a photoresist mask for the following etch or implant step. Block 608 is shown in dashed lines because pattern and implanting a channel stop, while preferred, is optional. The function of a channel stop may in some cases be performed by the Bird's Beak implant. However, a channel stop is preferred to further reduce source-to-drain leakage and is also desirable for some Bird's Beak mask geometries, such as those in which the BB pattern does not completely surround all moat regions. In block 610, a field oxide is grown outside the moat regions. The nitride mask layer and pad oxide are removed in block 612 to make a fresh surface for growing a thin gate oxide over the moat region in block 614. The Bird's Beak region is patterned and implanted in block 616. This is the preferred position in the sequence for the Bird's Beak pattern and implant step, as indicated in FIG. 6 by assigning it lower case Roman numeral (i). It is preferable to perform the Bird's Beak implant after growing the thick field oxide, because then the concentration can be well controlled, the doping not consumed or diffused by the oxidation process, and the lateral position well controlled in relation to the edges of the moat. However, there are several places within the process that are alternatives for performing a patterning and implanting step to dope the Bird's Beak region, indicated by Roman numerals (ii) through (v), which can be used in conjunction with different configurations of the BB mask as well as the CHSTOP mask in order to implement different doping profiles. After the Bird's Beak implant (and resist strip), a gate material, preferably polysilicon, but alternatively a metal, is deposited and doped if necessary to increase its conductivity in block 618. Then the gate is patterned and etched in block 620. The n-type source and drain regions are then patterned and implanted with one or more N+ dopants. Finally, the process ends with all additional steps required for completing the device, or an integrated circuit containing the device, being performed in block 624, which includes metallizations, interlayer dielectrics, protective overcoat, packaging, etc. The remainder of these processes required to create a device or integrated circuit are well known to those skilled in the art of semiconductor processing.

Figure 2B:
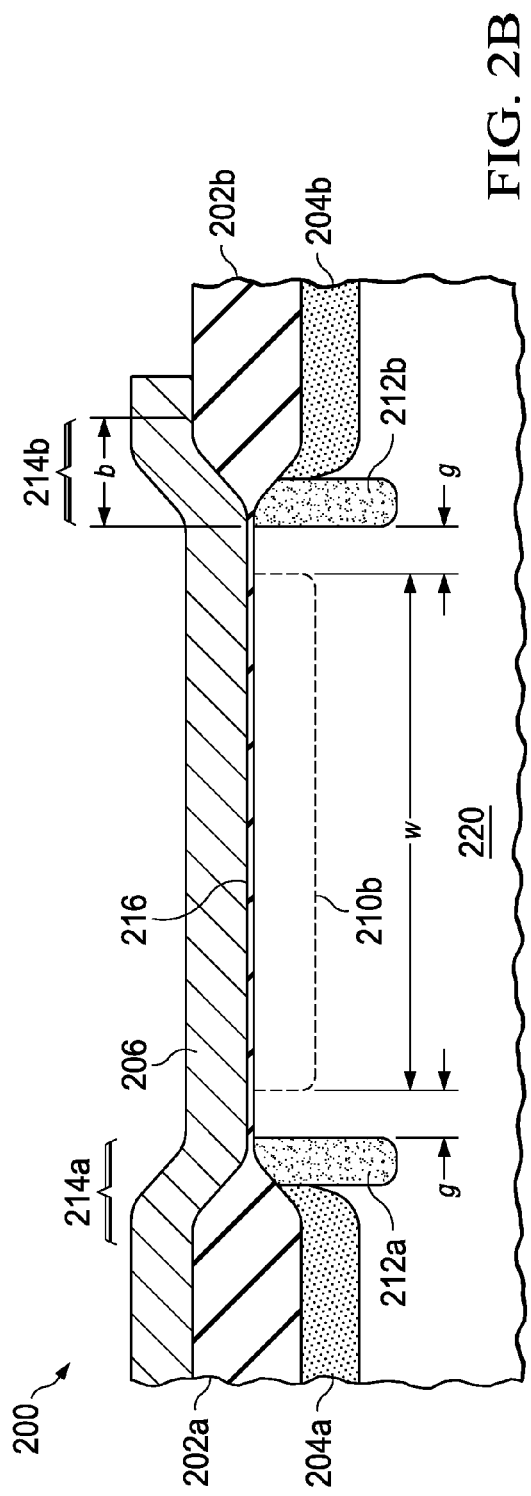
FIGS. 2B and 2C shows a cross-sectional views of the radiation-hardened MOS device of one embodiment of the present disclosure FIG. 1.
Figure 2C:
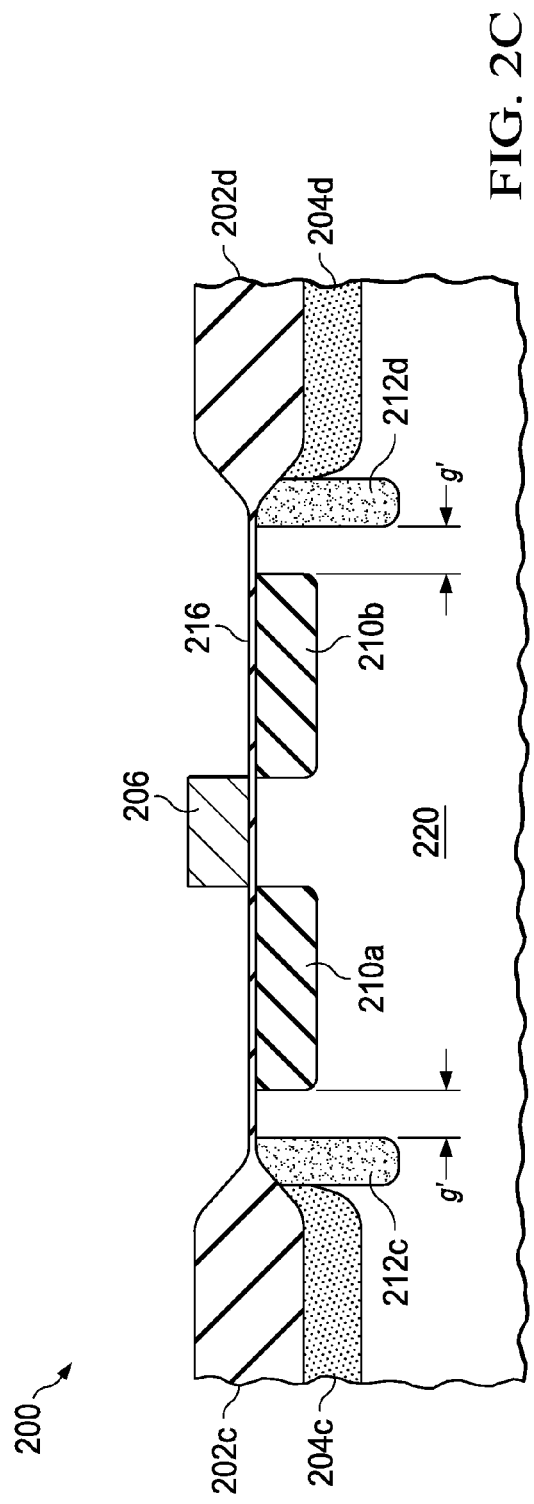
Figure 12A:
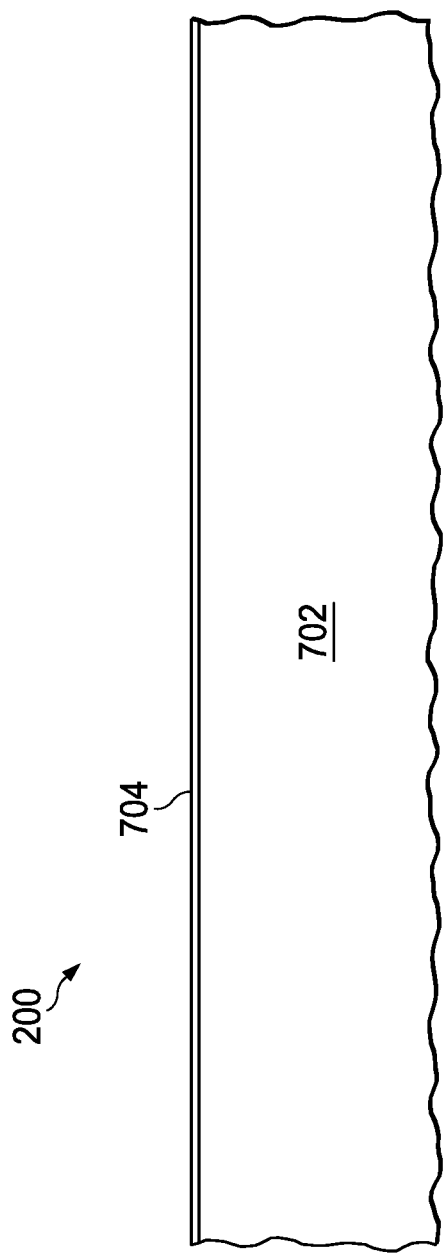
Figure 12B:
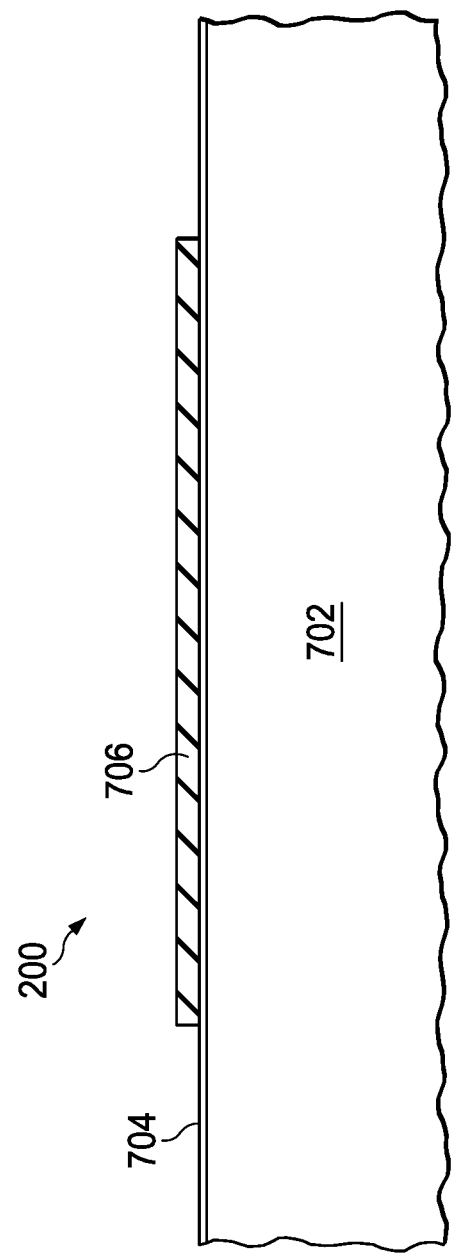

FIGS. 12A through 12H depict a series of cross-sectional views of an embodiment of a radiation hardened MOS device 200 similar to that shown in FIGS. 2A, 2B, and 2C, as fabricated using process 600. These views look in the same direction as the view in FIG. 2B, which shows cross-section A-A from FIG. 2A. FIGS. 12A through 12H show "snapshots" of a device taken at various steps during process 600. FIG. 12A shows the device after the start 602 of the process, showing substrate 702 with thin pad oxide layer 704 on it. Typical thickness of a pad oxide is 100 to 500 angstroms. FIG. 12B shows the device after block 606, showing a nitride layer deposited and etched to form the moat pattern. A typical nitride thickness is 1,000 to 2,000 angstroms. FIG. 12C shows the implantation of a channel stop during the implant phase of block 608, where photoresist masking layer 708 has been deposited, baked, and developed to form the channel stop pattern, and p-type ions 710 are in the process of being implanted through the open areas in the photoresist to form channel stop implanted regions 712a and 712b. Typical photoresist thicknesses are between 1 and 2 µm. Although in reality incident ions blanket the wafer, for clarity only the open areas where ions are getting through to the substrate are shown with arrows symbolizing the incident ions. FIG. 12D shows the results of step 610, after resist has been stripped and a thermal oxidation step has grown a thick field oxide shown as segments 714a on the left and 714b and on the right, leaving thinner channel stop regions 712a and 712b underlying the field oxide, and showing that the Bird's Beak region grows under the edge of the nitride mask 706, thereby pushing its edges upward slightly. It can also be seen that the channel stop doping does not extend inward to the thin oxide, due to the oxide encroachment under the nitride. In FIG. 12E, nitride and pad oxide have been removed in block 614, and gate oxide 716 has been grown over the moat region. FIG. 12F depicts the Bird's Beak implant step 616 during the implantation of p-type ions 720 through Bird's Beak photoresist mask 718 having openings over the Bird's Beak areas, and creating implanted regions 722a and 722b underneath the Bird's Beak regions. The Bird's Beak implant only penetrates the thinner areas of the tapered oxide within the Bird's Beak region, and thus it can be seen that the implanted regions 722a and 722b are typically narrower than the openings in the Bird's Beak mask 718. The gate 724 (typically polysilicon) is shown fully formed in a snapshot after step 620, having been deposited, doped, patterned, and etched, and the resist stripped before this view. FIG. 12H shows the implanting of n-type dopants 730 through a patterned NSD photoresist mask 728 to form a source and drain, one of which 726 can be seen in dashed lines on the other side of the cross-section through the gate. After the resist is stripped, the state of the device after step 622 in process 600 would look like FIG. 2B.

Referring now to FIG. 13, a portion of a CMOS integrated circuit (IC) 800 is shown in an isometric view cross-sectioned through two transistors 840 and 850. A completed radiation hardened NMOS transistor employing the designs and techniques of the present disclosure is shown generally located in the region indicated by 840, and a completed PMOS transistor made in an exemplary n-well process is shown generally located in the region indicated by 850. With respect to the NMOS transistor 840, features familiar from the cross-section shown in FIG. 2C are indicated, including field oxide 802, channel stop segments 804a and 804b, source 810a and drain 810b, and Bird's Beak implant regions 812a and 812b. It can be seen that p-type channel stop segment 804b is intentionally separated from the n-well of PMOS transistor 850 in order to maintain a high breakdown voltage of the PMOS transistor. In some processes, an n-type channel stop is provided under the field oxide proximate the PMOS transistors. In addition to features shown in FIG. 2C, further layers and structures needed to provide interconnection between various devices and protective overcoating of the circuitry are also shown in FIG. 8. As one example, metal interconnect 832 is shown making contact to drain regions in both transistors through contacts holes in a protective insulating $SiO_2$ layer. The structures illustrated in areas away from the radiation hardened NMOS transistor are merely exemplary, and any suitable similar integrated circuit structures and processes may be substituted.

According to one embodiment of the present disclosure, radiation hardened MOS devices with low radiation-induced leakage are provided that are suitable for application in NMOS, CMOS, or BiCMOS integrated circuits for operation in high-radiation environments, but with high breakdown voltages enabled by the device design. The devices provided by this disclosure may also be used in other applications requiring high breakdown voltage and low leakage. According to another embodiment of the present disclosure, a method for fabricating radiation hard MOS devices has been provided along with several alternatives for the placement of a step of patterning and implanting the Bird's Beak region to reduce leakage. According to a third embodiment of the present disclosure, an integrated circuit containing radiation hardened MOS devices fabricated using variations on a LOCOS process including minor layout changes and a Bird's Beak implant step has been provided. The concepts presented herein provide radiation hardened devices and circuits that exhibit lower radiation-induced leakage currents while maintaining high breakdown voltages and a minimal change in circuit density.

It will be appreciated that the present inventive method of fabricating radiation hardened MOS devices, which has originally been applied to fabricating NMOS devices within a CMOS or BiCMOS integrated circuit, is also applicable to fabricating other types of integrated circuits containing other devices including, for example, PMOS devices, bipolar junction transistors, diodes, resistors and capacitors. It should also be appreciated that such an integrated circuit is representative of only one suitable environment for use of the disclosure, and that the disclosure may be used in a multiple of other environments in the alternative. The disclosure should therefore not be limited to the particular implementations as discussed herein.

Although preferred embodiments of the present disclosure have been described in detail, it will be understood by those skilled in the art that various modifications can be made therein without departing from the spirit and scope of the disclosure as set forth in the claims.

What is claimed is:

1. An integrated circuit, comprising:
   a silicon substrate having a moat region for a device, a channel region positioned within the moat region, and a diffusion region positioned within the moat region and adjacent to the channel region along a length direction of the device;
   a field oxide layer formed above the silicon substrate, the field oxide layer having a tapered edge surrounding the moat region; and
   a gate layer formed above the silicon substrate, the gate layer extending across the moat region along the length direction of the device, and the gate layer abutting the tapered edge of the field oxide layer.

2. The integrated circuit of claim 1, wherein the gate layer includes:
   a gate oxide layer formed on the silicon substrate; and
   a polycrystalline silicon layer formed on the gate oxide layer.

3. The integrated circuit of claim 1, wherein the gate layer includes:
   a first segment overlapping with the channel region; and
   a second segment extending across the moat region along the length direction and abutting the tapered edge of the field oxide layer along the length direction.

4. The integrated circuit of claim 3, wherein the gate layer includes:
   a third segment abutting the tapered edge of the field oxide layer along a channel width direction and joining the second segment to define an opening for selectively accessing the diffusion region.

5. The integrated circuit of claim 3, wherein the second segment is free of contact from the tapered edge of the field oxide layer along a channel width direction.

6. The integrated circuit of claim 3, wherein the first segment joins the second segment to form a T-shape mask defining an opening for selectively accessing the diffusion region.

7. The integrated circuit of claim 1, wherein the gate layer laterally surrounds the diffusion region.

8. The integrated circuit of claim 1, wherein the gate layer partially surrounds the diffusion region.

9. The integrated circuit of claim 1, wherein the silicon substrate includes an epitaxial layer.

10. The integrated circuit of claim 9, wherein the gate layer is positioned above the epitaxial layer.

11. An integrated circuit, comprising:
    a semiconductor substrate having moat regions, each for forming a transistor device, each of the moat regions includes a channel region and a diffusion region adjacent to the channel region along a device length direction of the respective transistor device;
    a field oxide layer formed above the semiconductor substrate, the field oxide layer having tapered edges surrounding the moat regions; and
    gate layers formed above the semiconductor substrate, each of the gate layers extending within and across one of the moat regions along the device length direction of the respective transistor device, and the each of the gate layers abutting the respective tapered edge of the field oxide layer.

12. The integrated circuit of claim 11, wherein each of the gate layers includes:
    a gate oxide layer formed on the semiconductor substrate; and
    a polycrystalline silicon layer formed on the gate oxide layer.

13. The integrated circuit of claim 11, wherein each of the gate layers includes:
    a first segment overlapping with the respective channel region; and a second segment extending across the respective moat region along the device length direction and abutting the tapered edge of the field oxide layer along the device length direction.

14. The integrated circuit of claim 13, wherein each of the gate layers includes:
a third segment abutting the tapered edge of the field oxide layer along a channel width direction of the respective transistor device and joining the second segment to define an opening for selectively accessing the respective diffusion region.

15. The integrated circuit of claim 13, wherein the second segment is free of contact from the tapered edge of the field oxide layer along a channel width direction of the respective transistor device.

16. The integrated circuit of claim 13, wherein the first segment joins the second segment to form a T-shape mask defining an opening for selectively accessing the diffusion region of the respective transistor device.

17. The integrated circuit of claim 11, wherein each of the gate layers laterally surrounds the diffusion region of the respective transistor device.

18. The integrated circuit of claim 11, wherein each of the gate layers partially surrounds the diffusion region of the respective transistor device.

19. The integrated circuit of claim 11, wherein the semiconductor substrate includes an epitaxial layer.

20. The integrated circuit of claim 19, wherein each of the gate layers is positioned above the epitaxial layer.

* * * * *